United States Patent
Koo et al.

(10) Patent No.: US 7,902,602 B2
(45) Date of Patent: Mar. 8, 2011

(54) ORGANIC THIN FILM TRANSISTOR WITH STACKED ORGANIC AND INORGANIC LAYERS

(75) Inventors: Jae-Bon Koo, Yongin-si (KR); Min-Chul Suh, Seongnam-si (KR); Yeon-Gon Mo, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 26 days.

(21) Appl. No.: 11/158,049

(22) Filed: Jun. 22, 2005

(65) Prior Publication Data

US 2005/0285102 A1 Dec. 29, 2005

(30) Foreign Application Priority Data

Jun. 24, 2004 (KR) .................. 10-2004-0047892

(51) Int. Cl.
H01L 27/13 (2006.01)
(52) U.S. Cl. .................. 257/347; 257/E51.007
(58) Field of Classification Search .................. 257/40, 257/E29.137, 642, 643, E27.117, E25.008, 257/E39.007, E51.005, E51.006, E51.007; 438/149

See application file for complete search history.

(56) References Cited

U.S. PATENT DOCUMENTS

| | | | |
|---|---|---|---|
| 5,347,144 A | | 9/1994 | Garnier et al. |
| 5,912,473 A * | | 6/1999 | Wakita et al. .................. 257/40 |
| 5,946,551 A * | | 8/1999 | Dimitrakopoulos et al. ... 438/99 |
| 6,057,896 A * | | 5/2000 | Rho et al. .................. 349/42 |
| 6,433,359 B1 * | | 8/2002 | Kelley et al. .................. 257/40 |
| 2002/0071065 A1 * | | 6/2002 | Lee .................. 349/43 |
| 2004/0012017 A1 | | 1/2004 | Nagayama |
| 2004/0065929 A1 * | | 4/2004 | Koo et al. .................. 257/410 |
| 2004/0077122 A1 | | 4/2004 | Wu |
| 2004/0161873 A1 * | | 8/2004 | Dimitrakopoulos et al. ... 438/99 |
| 2004/0222412 A1 * | | 11/2004 | Bai et al. .................. 257/40 |
| 2004/0251474 A1 * | | 12/2004 | Uchida et al. .................. 257/202 |
| 2005/0001210 A1 * | | 1/2005 | Lee et al. .................. 257/40 |
| 2005/0104058 A1 * | | 5/2005 | Veres et al. .................. 257/40 |
| 2005/0211975 A1 * | | 9/2005 | Kawasaki et al. .................. 257/40 |
| 2006/0027805 A1 * | | 2/2006 | Koo et al. .................. 257/59 |
| 2006/0267094 A1 * | | 11/2006 | Ahn et al. .................. 257/347 |
| 2007/0138476 A1 * | | 6/2007 | Chae et al. .................. 257/72 |

(Continued)

FOREIGN PATENT DOCUMENTS

JP 10-270712 10/1998

(Continued)

OTHER PUBLICATIONS

Machine English translation of JP2004-128124 of record.*

(Continued)

*Primary Examiner* — Davienne Monbleau
*Assistant Examiner* — Christopher M Roland
(74) *Attorney, Agent, or Firm* — H.C. Park & Associates, PLC (57) ABSTRACT

The present invention provides an organic thin film transistor and method for fabricating the same. The organic thin film transistor has a substrate and a gate electrode that is positioned on the substrate. A gate insulator has a stacked structure comprising an inorganic gate insulator and an organic gate insulator that are positioned on the gate electrode. An organic semiconductor layer is positioned on the gate insulator to overlap the gate electrode. Accordingly, an organic thin film transistor that has flexibility, decreased leakage current, and a low threshold is formed.

28 Claims, 4 Drawing Sheets

U.S. PATENT DOCUMENTS

2007/0178710 A1 * 8/2007 Muyres et al. ............... 438/778

FOREIGN PATENT DOCUMENTS

| JP | 2003-086804 | 3/2003 |
| JP | 2003-142692 | 5/2003 |
| JP | 2003-282883 | 10/2003 |
| JP | 2004031801 | 1/2004 |
| JP | 2004080026 | 3/2004 |
| JP | 2004128124 | 4/2004 |
| JP | 2004241528 A * | 8/2004 |
| JP | 2005513788 | 5/2005 |
| KR | 10-1998-0023386 | 7/1998 |
| WO | 03052841 | 6/2003 |

OTHER PUBLICATIONS

Chinese Office Action mailed Jun. 27, 2008.

* cited by examiner

FIG. 4

ORGANIC THIN FILM TRANSISTOR WITH STACKED ORGANIC AND INORGANIC LAYERS

CROSS-REFERENCE TO RELATED APPLICATION

This application claims priority to and the benefit of Korean Patent Application No. 2004-47892, filed Jun. 24, 2004, the disclosure of which is incorporated by reference in its entirety.

BACKGROUND OF THE INVENTION

1. Field of the Invention

The present invention relates to a thin film transistor (TFT). In particular, the present invention relates to an organic TFT including an organic semiconductor layer and a method for fabricating the same.

2. Description of the Related Art

In general, a thin film transistor (TFT) includes a semiconductor layer, a gate electrode, a source electrode, and a drain electrode. The semiconductor layer may be formed of a polysilicon layer or an amorphous silicon layer. However, organic compounds such as polyacethylene, which is a conjugated organic polymer, have been studied in recent years. Polyacethylene may have semiconductive properties when it is subjected to doping. Organic TFTs (OTFT) that have an organic semiconductor layer are actively being developed.

Since OTFTs are flexible, using an OTFT in a display device creates a new flexible type of display, which could not be accomplished using only an inorganic TFT.

In order for the OTFT display to have complete flexibility, it is preferable that all constituents of the device, including the semiconductor layer, are formed of an organic material. An OTFT formed using an organic semiconductor layer and an organic gate insulator is disclosed in U.S. Pat. No. 5,347,144. This patent discloses a TFT that has a thin film semiconductor layer that is positioned between a source and a drain, where one surface of the semiconductor layer is in contact with an insulator and the other surface is in contact with a conductive grid. In addition, the semiconductor layer is made of at least one conjugated polymer, and the insulator is made of an insulating organic polymer that has a dielectric constant of at least 5.

However, the organic gate insulator may incur a pin hole during its formation, and have a high leakage current due to the weakness of the material itself. For this reason, the organic gate insulator is formed to a thickness of 5000 Å or more. This may cause the capacitance of the gate insulator, which is inversely proportional to the thickness, to decrease and a threshold voltage, which is inversely proportional to the capacitance, may increase. This may cause an increase in a driving voltage of a device to which the TFT is applied.

SUMMARY OF THE INVENTION

The present invention provides a TFT that has an organic gate insulator that allows the TFT to have flexibility, a low threshold voltage, and a low leakage current.

The present invention also provides a method of fabricating a TFT that has an organic gate insulator.

Additional features of the invention will be set forth in the description which follows, and in part will be apparent from the description, or may be learned by practice of the invention.

The present invention discloses an OTFT that includes a substrate and a gate electrode that is positioned on the substrate. A gate insulator with a stacked structure that comprises an inorganic gate insulator and organic gate insulator is positioned on the gate electrode. An organic semiconductor layer which overlaps the gate electrode is positioned on the gate insulator.

The present invention also discloses an OTFT that includes a substrate and a gate electrode that is positioned on the substrate. An inorganic gate insulator that is an oxide layer of the gate electrode is positioned on the gate electrode. An organic gate insulator is positioned on the inorganic gate insulator. An organic semiconductor layer is positioned on the organic gate insulator to overlap the gate electrode.

The present invention also discloses a method for fabricating an OTFT that includes preparing a substrate, depositing a gate conductive layer on the substrate, and patterning the gate conductive layer to form a gate electrode. An inorganic gate insulator is then formed on the gate electrode. An organic gate insulator is formed on the inorganic gate insulator. An organic semiconductor layer is formed on the organic gate insulator to overlap the gate electrode.

The present invention also discloses a method for fabricating an OTFT that includes preparing a substrate, forming a gate conductive layer on the substrate, and forming an inorganic insulator on the gate conductive layer. The method also comprises sequentially patterning the inorganic insulator and the gate conductive layer to form a gate electrode and an inorganic gate insulator that is positioned on the gate electrode. The method further comprises forming an organic gate insulator on the inorganic gate insulator, and forming an organic semiconductor layer on the organic gate insulator to overlap the gate electrode.

The present invention also discloses an OTFT that includes a substrate and an organic semiconductor layer that is positioned on the substrate. A gate insulator with stacked inorganic gate insulator and organic gate insulator layers is formed on the organic semiconductor layer. A gate electrode is positioned on the gate insulator to overlap the organic semiconductor layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

Figure 1A:
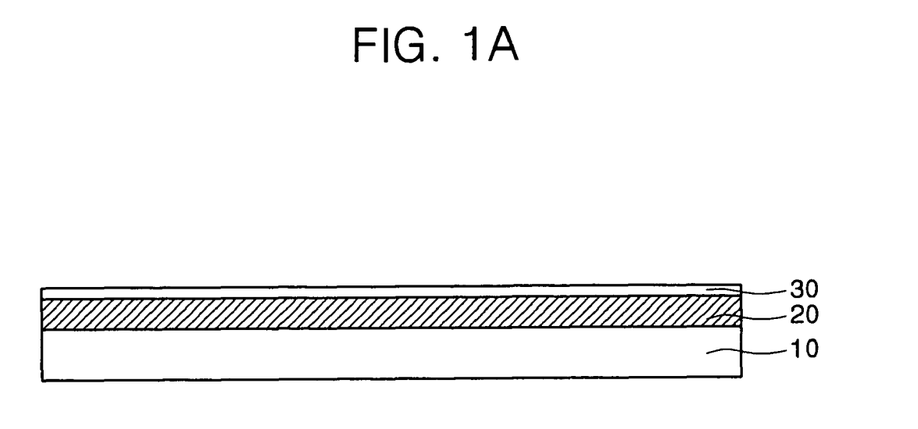
FIG. 1A and FIG. 1B are cross-sectional views that illustrate process steps in a method for fabricating an OTFT in accordance with an exemplary embodiment of the present invention.
Figure 1B:
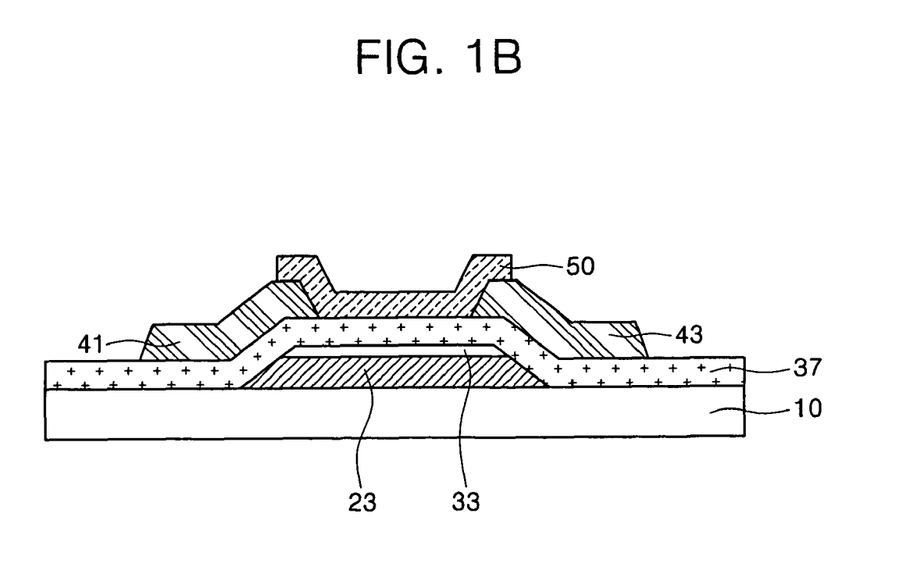

FIG. 1A and FIG. 1B are cross-sectional views that illustrate process steps in a method for fabricating an OTFT in accordance with an exemplary embodiment of the present invention.

Referring to FIG. 1A, a substrate 10 is prepared. The substrate 10 may be made of glass, plastic, sapphire, or quartz, for example. Preferably, the substrate 10 is a flexible material such as a plastic.

A gate conductive layer 20 is formed on the substrate 10. The gate conductive layer 20 may be formed of Ta, W, Ti, Mo, Al, Au, Cu, Y, Zn, Hf, Zr, or an alloy thereof, for example. The alloy may be one of MoW, AlNd, AlCu, AuTi, and AuCr. Alternatively, the gate conductive layer 20 may comprise doped silicon or a conductive organic material.

A barrier layer (not shown) may be formed on the substrate 10 prior to the formation of the gate conductive layer 20. The barrier layer protects a subsequently formed organic semiconductor layer from moisture or an organic gas that may be introduced from the exterior or the substrate 10.

An inorganic insulator 30 is formed on the gate conductive layer 20. The inorganic insulator 30 may comprise a metal oxide, a ferroelectric insulator, or at least one material including, but not limited to silicon oxide, silicon nitride, and silicon oxynitride. The metal oxide layer may comprise aluminum oxide ($Al_2O_3$), yttrium oxide ($Y_2O_3$), zinc oxide ($ZnO_2$), hafnium oxide ($HfO_2$), zirconium oxide ($ZrO_2$), tantalum oxide ($Ta_2O_5$), and titanium oxide ($TiO_2$). The ferroelectric insulator may comprise $PbZ_xTi_{1-x}O_3$(PZT), $Bi_4Ti_3O_{12}$, $BaMgF_4$, and $Ba_xSr_{1-x}TiO_3$(BST), for example.

The inorganic insulator 30 may be formed by physical vapor deposition (PVD), chemical vapor deposition (CVD), laser ablation, or sol gel spin coating, for example. In particular, it may be formed by evaporation, a sputtering, low pressure CVD (LPCVD), or plasma enhanced CVD (PECVD).

Alternatively, the inorganic insulator 30 may be an oxide layer that is formed by oxidizing the gate conductive layer 20. In particular, the gate conductive layer 20 may be oxidized by anodic oxidation, plasma oxidation, or UV ozone oxidation, for example. In this case, the gate conductive layer 20 may comprise a material including, but not limited to Al, Y, Zn, Hf, Zr, Ta, Ti, and an alloy thereof. The gate conductive layer 20 preferably comprises an aluminum-molybdenum alloy or titanium.

Referring to FIG. 1B, a photoresist pattern (not shown) is formed on the inorganic insulator (30 of FIG. 1A). The inorganic insulator (30 of FIG. 1A) and the gate conductive layer (20 of FIG. 1A) are sequentially patterned using the photoresist pattern as a mask to form an inorganic gate insulator 33 and a gate electrode 23. As a result, the inorganic gate insulator 33 is disposed on a top surface of the gate electrode 23.

An organic gate insulator 37 is formed on the inorganic gate insulator 33. The organic gate insulator 37 may comprise a vinyl-based polymer, a styrene-based polymer, an acrylic-based polymer, an epoxy-based polymer, an ester-based polymer, a phenol-based polymer, an imide-based polymer, and cycloalkane, for example. In particular, the organic gate insulator 37 may include, but is not limited to polyethylene, polypropylene), polytetrafluoroethylene, polyvinyl chloride, polyvinyl alcohol, polyvinyl pyrrolidone, polystyrene, polyacrylate, polymethylmethacrylate, polyacrylonitrile, polycarbonate, polyethyleneterephthalate, parylene, polyphenylenesulfide, polyimide, benzocyclobutene, and cyclopentene.

The organic gate insulator 37 may be formed by using vapor deposition, sublimation, or a solution method. In particular, the organic gate insulator 37 may be formed by thermal evaporation, organic molecular beam deposition (OMBD), spin-coating, or dip-coating. The organic gate insulator 37 may be between 3000 Å to 10000 Å thick.

The organic gate insulator 37 and the inorganic gate insulator 33 form a stacked gate insulator of the OTFT. The inorganic gate insulator 33 has a relatively dense film quality compared to the organic gate insulator 37. This quality of the inorganic gate insulator 33 reduces a leakage current of the TFT more than a gate insulator comprised of only the organic gate insulator 37. In addition, the inorganic gate insulator 33 has a relatively high dielectric constant compared to the organic gate insulator 37, which allows a lower threshold voltage of the TFT compared to a gate insulator comprising only the organic gate insulator 37.

In addition, the stacked arrangement of the gate insulator enhances the interface characteristics between the gate electrode 23 and the inorganic gate insulator 33 and between the organic gate insulator 37 and an organic semiconductor layer that is formed in a subsequent process. Moreover, the flexibility of the device may be enhanced by having the more rigid inorganic gate insulator 33 formed only on a top surface of the gate electrode 23.

The inorganic gate insulator 33 is preferably 3000 Å or less thick to allow flexibility of the device and morphology reduction. In addition, in fitting with the organic gate insulator 37, which does not have a dense film quality, the inorganic gate insulator is preferably 100 Å or more thick. More preferably, the inorganic gate insulator 33 is between 500 Å to 1000 Å thick.

A source conductive layer and a drain conductive layer are stacked and patterned on the organic gate insulator 37, to form a source electrode 41 and a drain electrode 43 which overlap the ends of the gate electrode 23. The organic gate insulator 37 above the gate electrode 23 is exposed between the source electrode 41 and drain electrode 43. The source conductive layer and drain conductive layer may be formed of a metal or a conductive organic layer. The source and drain conductive layers may be formed of Cr, Ti, Cu, Al, Mo, W, Ni, Au, Pt, Pd, polyaniline, or poly(3,4-ethylene dioxythiophene), for example. Preferably, the source conductive layer and drain conductive layer are formed of a material that has a suitable work function considering the ionization energy of a subsequently formed organic semiconductor layer.

Subsequently, an organic semiconductor layer 50 is formed on the organic gate insulator 37 in the region that is exposed between the source electrode 41 and drain electrode 43. As a result, the organic semiconductor layer 50 overlaps the gate electrode 23. The source electrode 41 and drain electrode 43 are positioned between an end of the gate electrode 23 and an end of the organic semiconductor layer 50 in order to be coupled to the organic semiconductor layer 50. This structure of the OTFT is referred to as a bottom contact structure and it can be fabricated by a simple process that reduces damage to the organic semiconductor layer 50. Alternatively, a top contact structure may be employed to form the OTFT where the source electrode 41 and drain electrode 43 are positioned above the organic semiconductor layer 50.

The organic semiconductor layer 50 may be formed by vapor deposition, sublimation, or a solution method, for example. In addition, it may be formed by thermal evaporation, OMBD, spin-coating, or dip-coating. Furthermore, the organic semiconductor layer 50 may be patterned using a shadow mask or a lift-off method.

The organic semiconductor layer 50 may comprise at least one material including, but not limited to polyacetylene, polythiophene, P3HT(poly(3-hexylthiophene-2,5-diyl)), F8T2(poly(9,9'-dioctylfluorene-co-bithiophene)), PTV(poly (thienylene vinylene)), pentacene, tetracene, rubrene, and α-6T(alpha-hexathienylene).

Figure 2A:
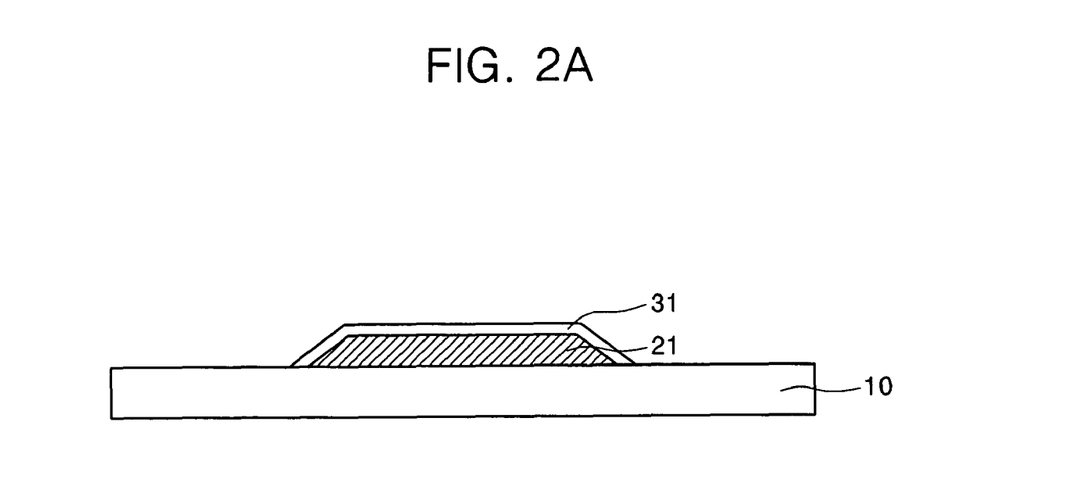
FIG. 2A and FIG. 2B are cross-sectional views that illustrate process steps in a method for fabricating an OTFT in accordance with another exemplary embodiment of the present invention.
Figure 2B:
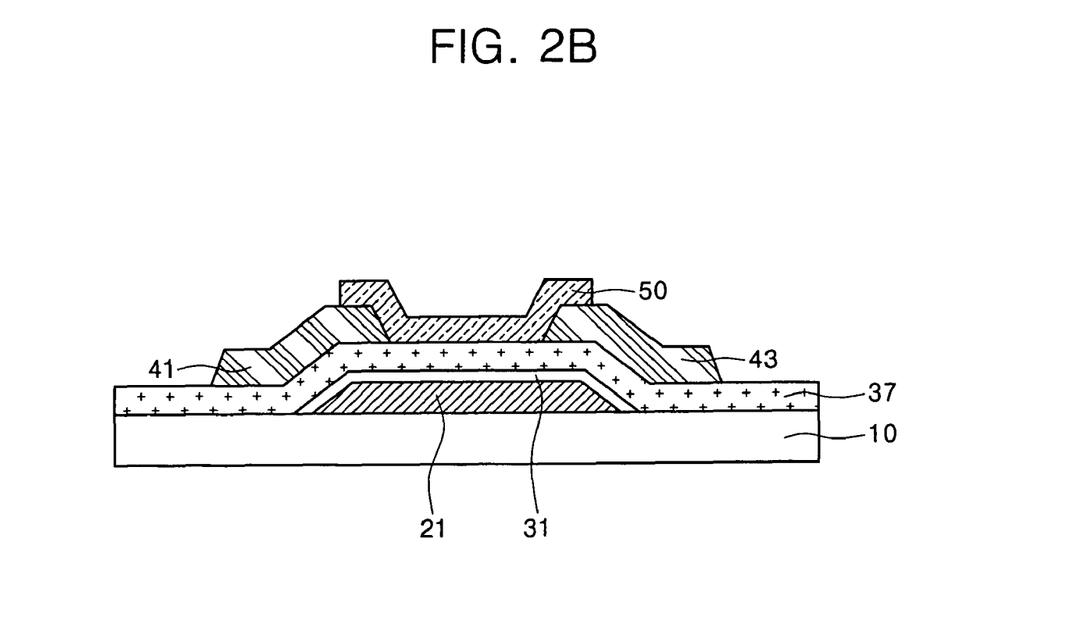

FIG. 2A and FIG. 2B are cross-sectional views that illustrates process steps in a method of fabricating an OTFT in accordance with another exemplary embodiment of the present invention.

Referring to FIG. 2A, a substrate 10 is prepared as in the previously described embodiment. A gate conductive layer is formed on the substrate 10, which is patterned to form a gate electrode 21.

Subsequently, an inorganic gate insulator 31 is formed to cover the gate electrode 21. In particular, the inorganic gate insulator 31 may be an oxide layer of the gate electrode 21 which is formed by oxidizing the gate electrode 21. Oxidizing the gate electrode 21 may be carried out by anodic oxidation, plasma oxidation, or UV ozone oxidation, for example. In this case, the gate electrode 21 may comprise at least one material including, but not limited to Al, Y, Zn, Hf, Zr, Ta, Ti, and an alloy thereof. Preferably, the gate electrode 21 is an aluminum-molybdenum alloy layer or a titanium layer.

Alternatively, the inorganic gate insulator 31 may be formed on the gate electrode 21 by forming an inorganic insulator using a method such as PVD, a CVD, laser ablation, or sol gel spin coating, and then patterning the inorganic insulator. In this case, the inorganic gate insulator 31 may be a metal oxide, a ferroelectric insulator, or at least one layer including, but not limited to silicon oxide, a silicon nitride, and silicon oxynitride. Specific examples of the metal oxide layer and the ferroelectric insulator are the same as in the previously described embodiment. In this case, the gate electrode 21 may be formed of at least one material such as Al, Y, Zn, Hf, Zr, Ta, Ti, and an alloy thereof. In particular, the alloy may be MoW, AlNd, AlCu, AuTi, or AuCr, for example. Alternatively, the gate electrode 21 may be a doped silicon layer or a conductive organic layer.

Referring to FIG. 2B, an organic gate insulator 37 is formed on the inorganic gate insulator 31. The material, method for forming, and thickness of the organic gate insulator 37 are similar to the previously described embodiments.

The organic gate insulator 37 and the inorganic gate insulator 31 form a stacked gate insulator of the OTFT. Accordingly, the TFT has increased flexibility due to the presence of the organic gate insulator 37 as well as a decreased leakage current and a lower threshold voltage. In particular, when the inorganic gate insulator 31 is an oxide layer of the gate electrode 21 and the organic gate insulator 37 is formed on the inorganic gate insulator 31, an interface characteristic between the gate electrode 21 and the gate insulator may be further enhanced. Moreover, the inorganic gate insulator 31 may not extend onto the substrate from a boundary of the gate electrode, thereby enhancing device flexibility.

Furthermore, the inorganic gate insulator 31 is preferably 3000 Å or less thick in order to maintain flexibility and morphology reduction. In addition, in order to complement the characteristic of the organic gate insulator which does not have a dense film quality, it is preferably 100 Å A or more. More preferably, the inorganic gate insulator is between 500 Å to 1000 Å thick.

Subsequently, source electrode 41, drain electrode 43, and an organic semiconductor layer 50 are formed using a method similar to the above-described embodiments.

Figure 3A:
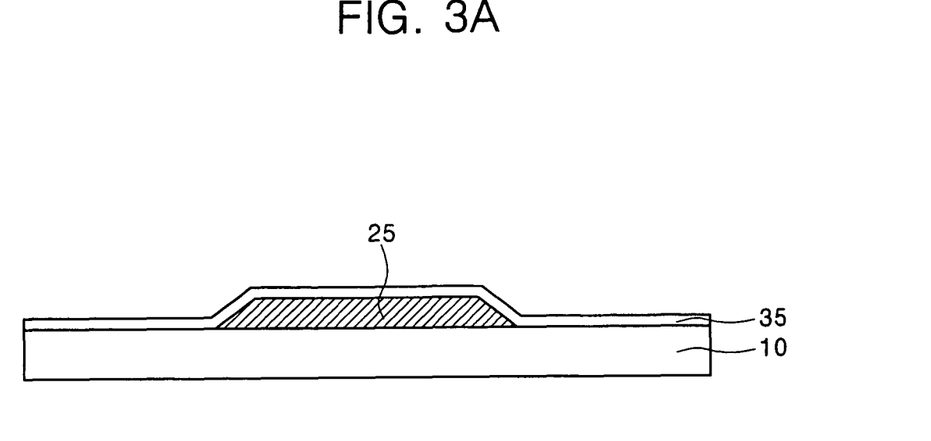
FIG. 3A and FIG. 3B are cross-sectional views that illustrate process steps in a method for fabricating an OTFT in accordance with another exemplary embodiment of the present invention.
Figure 3B:
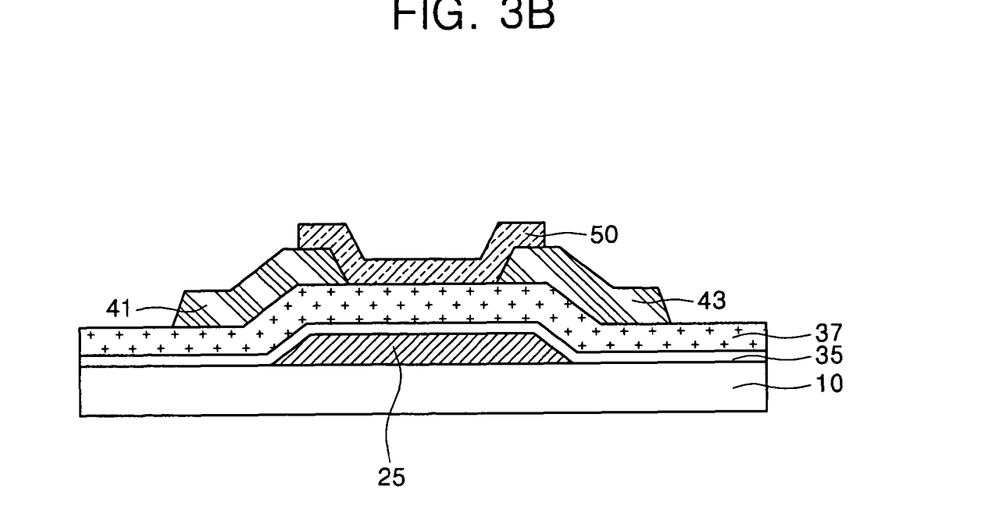

FIG. 3A and FIG. 3B are cross-sectional views that illustrates process steps for a method of fabricating an OTFT in accordance with another exemplary embodiment of the present invention.

Referring to FIG. 3A, a substrate 10 is prepared as in the previously described exemplary embodiments.

A gate conductive layer is formed on the substrate 10, and the gate conductive layer is patterned, so that a gate electrode 25 is formed. The gate conductive layer may be formed of a material including, but not limited to Ta, W, Ti, Mo, Al, Au, Cu, Y, Zn, Hf, Zr, and an alloy thereof. The alloy layer may comprise MoW, AlNd, AlCu, AuTi, and AuCr, for example. Alternatively, the gate conductive layer may be a doped silicon layer or a conductive organic layer.

An inorganic gate insulator 35 is deposited on the gate electrode 25 by a method such as PVD, CVD, laser ablation, or sol gel spin coating. In particular, it may be formed by a method such as evaporation, sputtering, LPCVD, or PECVD. As a result, the inorganic gate insulator 35 is formed to cover the gate electrode 25 and to extend onto the substrate from a boundary of the gate electrode 25.

The inorganic gate insulator 35 may be a metal oxide layer, a ferroelectric insulator, or at least one layer selected from a group consisting of a silicon oxide layer, a silicon nitride layer, and a silicon oxynitride layer. Specific examples of the metal oxide layer and the ferroelectric insulator are the same as in the previously described exemplary embodiments.

Referring to FIG. 3B, an organic gate insulator 37 is formed on the inorganic gate insulator 35. The material, method for forming, and thickness of the organic gate insulator 37 are the same as in the previously described embodiments.

The organic gate insulator 37 and the inorganic gate insulator 35 form a stacked gate insulator of the OTFT. This allows the TFT to be flexible, have a decreased leakage current, and a low threshold voltage. In particular, this configuration enhances the interface characteristics between the gate electrode 25 and the inorganic gate insulator 35 and between the organic gate insulator 37 and an organic semiconductor layer that is formed in a subsequent process.

The source electrode 41, drain electrode 43, and an organic semiconductor layer 50 are formed subsequently using a method similar to the previously described embodiments.

Figure 4:
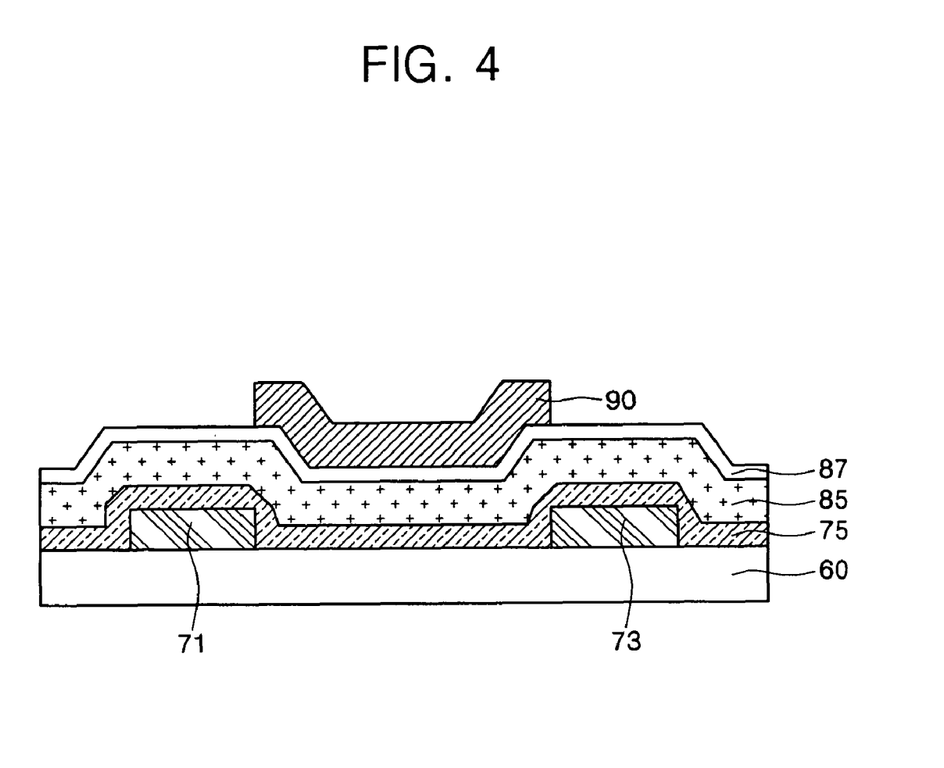
FIG. 4 is a cross-sectional view that illustrates a method for fabricating an OTFT in accordance with another exemplary embodiment of the present invention.

FIG. 4 is a cross-sectional view illustrating a method of fabricating an OTFT in accordance with another exemplary embodiment of the present invention. The OTFT according to the present embodiment is to a top gate OTFT, in contrast with the previously described embodiments.

Referring to FIG. 4, a substrate 60 is prepared in a similar manner as in the previously described embodiments.

Source and drain conductive layers are deposited and patterned on the substrate 60, to form a source electrode 71 and a drain electrode 73 that are spaced apart from each other. The source and drain conductive layers may be formed of a metal or a conductive organic layer including, but not limited to Cr, Ti, Cu, Al, Mo, W, Ni, Au, Pt, Pd, polyaniline, and PEDOT. The source and drain conductive layers are preferably formed of a material that has a suitable work function considering the ionization energy of a subsequently formed organic semiconductor layer.

A barrier layer (not shown) may be formed on the substrate 60 prior to the formation of the source electrode 71 and drain electrode 73. The barrier layer protects an organic semiconductor layer that is formed in a subsequent process from moisture or an organic gas that is introduced from the exterior or the substrate 60.

Subsequently, an organic semiconductor layer 75 is formed on the source electrode 71, drain electrode 73, and on a portion of the substrate 60 that is exposed between the source electrode 71 and drain electrode and 73 to couple the organic semiconductor layer 75 with the source electrode 71 and the drain electrode 73. This structure of the OTFT is referred to as a bottom contact structure and it is fabricated by a simplified process that reduces damage to the organic semiconductor layer 75.

The organic semiconductor layer 75 is formed of similar materials and using a method similar to the above-described embodiments.

The material, method of forming, and thickness of the organic gate insulator 85 is similar to that of the previously-described embodiments.

An inorganic gate insulator 87 is formed on the organic gate insulator 85. The inorganic gate insulator 87 may comprise a metal oxide, a ferroelectric insulator, or at least one material including, but not limited to a silicon oxide layer, a silicon nitride layer, and a silicon oxynitride layer. Specific examples of the metal oxide layer and the ferroelectric insulator are the same as in the previously described exemplary embodiments.

The inorganic gate insulator 87 may be formed by PVD, CVD, laser ablation, or a sol gel spin coating method. In particular, it may be formed by evaporation, sputtering, LPCVD, or PECVD, for example.

The organic gate insulator 85 and the inorganic gate insulator 87 form a stacked gate insulator of the OTFT. The inorganic gate insulator 87 has a relatively dense film quality compared to the organic gate insulator 85, which decreases a leakage current of the TFT when compared to forming the gate insulator of only the organic gate insulator 85. In addition, the inorganic gate insulator 87 has a relatively high dielectric constant compared to the organic gate insulator 85, which provides the TFT with a low threshold voltage. Accordingly, the TFT of the present invention has increased flexibility through the use of the organic gate insulator 85, and a decreased leakage current and a low threshold voltage.

Furthermore, this configuration of the TFT enhances interface characteristics between the organic semiconductor layer 75 and the organic gate insulator 85 and between the inorganic gate insulator 87 and a gate electrode that is formed in a subsequent process.

The thickness of the inorganic gate insulator 87 is similar to that of the previously-described embodiments.

A gate electrode 90 is formed on the inorganic gate insulator 87 to overlap the organic semiconductor layer 75. The composition of the gate electrode is similar to that of the previously-described embodiment

What is claimed is:

1. An organic thin film transistor (OTFT), comprising:
a substrate;
a gate electrode that is positioned on the substrate;
a gate insulator that is positioned on the gate electrode and has a stacked structure comprising an inorganic gate insulator and an organic gate insulator; and
an organic semiconductor layer that overlaps the gate electrode on the gate insulator,
wherein the organic gate insulator is arranged on an entire surface of the substrate and encapsulates the inorganic gate insulator,
wherein the organic gate insulator is disposed directly on the inorganic gate insulator and directly on the gate electrode,
wherein the organic gate insulator has a uniform thickness greater than a thickness of the inorganic gate insulator, and
wherein the thickness of the organic gate insulator is between 3000 Å to 10000 Å.

2. The OTFT of claim 1,
wherein the inorganic gate insulator comprises at least one layer selected from a group consisting of a silicon oxide layer, a silicon nitride layer, and a silicon oxynitride layer.

3. The OTFT of claim 1,
wherein the inorganic gate insulator comprises a metal oxide layer.

4. The OTFT of claim 3,
wherein the metal oxide layer comprises at least one layer selected from a group consisting of an aluminum oxide layer, an yttrium oxide layer, a zinc oxide layer, a hafnium oxide layer, a zirconium oxide layer, a tantalum oxide layer, and a titanium oxide layer.

5. The OTFT of claim 1,
wherein the inorganic gate insulator comprises a ferroelectric insulator.

6. The OTFT of claim 5,
wherein the ferroelectric insulator comprises at least one material selected from a group consisting of a $PbZ_xTi_{1-x}O_3$(PZT) layer, a $Bi_4Ti_3O_{12}$ layer, a $BaMgF_4$ layer, and a $Ba_xSr_{1-x}TiO_3$(BST) layer.

7. The OTFT of claim 1,
wherein the inorganic gate insulator comprises an oxide layer of the gate electrode.

8. The OTFT of claim 7,
wherein the gate electrode comprises at least one material selected from a group consisting of aluminum, yttrium, zinc, hafnium, zirconium, tantalum, titanium, and an alloy thereof.

9. The OTFT of claim 8,
wherein the gate electrode comprises an aluminum-molybdenum alloy layer or a titanium layer.

10. The OTFT of claim 1,
wherein the thickness of the inorganic gate insulator is between 100 Å to 3000 Å.

11. The OTFT of claim 1,
wherein the wherein the organic gate insulator comprises at least one material selected from a group consisting of a vinyl-based polymer, a styrene-based polymer, an acrylic-based polymer, an epoxy-based polymer, an ester-based polymer, a phenol-based polymer, an imide-based polymer, and cycloalkane.

12. The OTFT of claim 11,
wherein the organic gate insulator comprises at least one material selected from a group consisting of polyethylene, polypropylene, poly(tetrafluoro ethylene), poly(vinyl chloride), poly(vinyl alchol), poly(vinyl pyrrolidone), polystyrene, polyacrylate, poly (methylmethacrylate), poly(acrylonitrile), polycarbonate, poly(ethylene terephthalate), parylene, poly(phenylene sulfide), polyimide, benzocyclobutene, and cyclopentene.

13. The OTFT of claim 1,
wherein the inorganic gate insulator is positioned on a top surface of the gate electrode, and the organic gate insulator is positioned on the inorganic gate insulator.

14. The OTFT of claim 13,
wherein the inorganic gate insulator covers the gate electrode.

15. The OTFT of claim 14,
wherein the inorganic gate insulator comprises an oxide layer of the gate electrode.

16. The OTFT of claim 1,
wherein the substrate comprises a material selected from a group consisting of a glass, a plastic, a sapphire, and quartz.

17. The OTFT of claim 1,
wherein the organic semiconductor layer comprises at least one material selected from a group consisting of polyacetylene, polythiophene, P3HT(poly(3-hexylthiophene-2,5-diyl)), F8T2(poly(9,9'-dioctylfluorene-co-bithiophene)), PTV(poly(thienylene vinylene)), pentacene, tetracene, rubrene, and α-6T(alpha-hexathienylene).

18. The OTFT of claim 1, further comprising:
a source electrode; and
a drain electrode;
wherein the source electrode and drain electrode are positioned between an end of the gate electrode and an end of the organic semiconductor layer to be coupled to the organic semiconductor layer.

19. The OTFT of claim 1, further comprising a source electrode and a drain electrode disposed directly on the organic gate insulator.

20. The OTFT of claim 19, wherein the organic semiconductor layer is arranged on a side surface and a top surface of at least one of the source electrode and the drain electrode.

21. An organic thin film transistor (OTFT), comprising:
a substrate;
a gate electrode positioned on the substrate;
an inorganic gate insulator positioned on the gate electrode;
an organic gate insulator positioned on the inorganic gate insulator; and
an organic semiconductor layer overlapping the gate electrode on the organic gate insulator,
wherein the inorganic gate insulator comprises an oxide layer of the gate electrode,
wherein the organic gate insulator is arranged on an entire surface of the substrate and encapsulates the inorganic gate insulator,
wherein the organic gate insulator is disposed directly on the inorganic gate insulator and directly on the gate electrode,
wherein the organic gate insulator has a uniform thickness greater than a thickness of the inorganic gate insulator, and
wherein the thickness of the organic gate insulator is between 3000 Å to 10000 Å.

22. The OTFT of claim 21,
wherein the gate electrode comprises at least one material selected from a group consisting of aluminum, yttrium, zinc, hafnium, zirconium, tantalum, titanium, and an alloy thereof.

23. The OTFT of claim 22,
wherein the gate electrode comprises an aluminum-molybdenum alloy layer or a titanium layer.

24. The OTFT of claim 21,
wherein the thickness of the inorganic gate insulator is between 100 Å to 3000 Å.

25. The OTFT of claim 21,
wherein the organic gate insulator comprises at least one material selected from a group consisting of a vinyl-based polymer, a styrene-based polymer, an acrylic-based polymer, an epoxy-based polymer, an ester-based polymer, a phenol-based polymer, an imide-based polymer, and cycloalkane.

26. The OTFT of claim 25,
wherein the organic gate insulator is at least one material layer selected from a group consisting of polyethylene, polypropylene, poly(tetrafluoro ethylene), poly(vinyl chloride), poly(vinyl alchol), poly(vinyl pyrrolidone), polystyrene, polyacrylate, poly(methylmethacrylate), poly(acrylonitrile), polycarbonate, poly(ethylene terephthalate), parylene, poly(phenylene sulfide), polyimide, benzocyclobutene, and cyclopentene.

27. The OTFT of claim 21, further comprising a source electrode and a drain electrode disposed directly on the organic gate insulator.

28. The OTFT of claim 27, wherein the organic semiconductor layer is arranged on a side surface and a top surface of at least one of the source electrode and the drain electrode.

* * * * *